United States Patent
Reichel et al.

(10) Patent No.: US 8,102,171 B2
(45) Date of Patent: Jan. 24, 2012

(54) MEASURING DEVICE AND MEASURING METHOD FOR MEASURING THE ENVELOPE POWER AND THE MEAN-POWER VALUE

(75) Inventors: Thomas Reichel, Baldham (DE); Toralf Bratfisch, Putzbrunn (DE); Michael Katzer, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 502 days.

(21) Appl. No.: 12/301,959

(22) PCT Filed: Apr. 26, 2007

(86) PCT No.: PCT/EP2007/003701
§ 371 (c)(1),
(2), (4) Date: Apr. 14, 2009

(87) PCT Pub. No.: WO2007/137658
PCT Pub. Date: Dec. 6, 2007

(65) Prior Publication Data
US 2010/0289477 A1    Nov. 18, 2010

(30) Foreign Application Priority Data

May 26, 2006  (DE) .......................... 10 2006 024 698
Aug. 14, 2006  (DE) .......................... 10 2006 038 031

(51) Int. Cl.
   *G01R 23/00*    (2006.01)
(52) U.S. Cl. .................................................... 324/76.19
(58) Field of Classification Search ................ 324/76.19
See application file for complete search history.

(56) References Cited

U.S. PATENT DOCUMENTS

| | | | |
|---|---|---|---|
| 4,250,552 A | 2/1981 | Elms | |
| 4,447,803 A * | 5/1984 | Crosby et al. | 341/131 |
| 4,968,987 A * | 11/1990 | Naka et al. | 341/143 |
| 5,083,080 A * | 1/1992 | Tagiri | 324/118 |
| 5,451,947 A | 9/1995 | Morrison | |

(Continued)

FOREIGN PATENT DOCUMENTS

DE    690 19 422 T2    3/1996

(Continued)

OTHER PUBLICATIONS

International Search Report, WO 2007/137658 A1, Rohde & Schwarz GmbH & Co. KG, Dec. 6, 2007, pp. 1-6.

(Continued)

*Primary Examiner* — Patrick Assouad
*Assistant Examiner* — Kathryn Chang
(74) *Attorney, Agent, or Firm* — Ditthavong Mori & Steiner, P.C.

(57) ABSTRACT

A measuring device for measuring the envelope power and the mean-power value of a high-frequency signal. The measuring device includes a detector for detecting the high-frequency signal and for generating an analog detector signal, an analog/digital converter for generating a digital signal and an evaluation device for evaluating the digital signal. A dither supply device for the supply of a dither signal is disposed between the detector and the analog/digital converter, and a dither elimination device for eliminating the dither signal is disposed between the analog/digital converter and the evaluation device. The dither supply device supplies a different dither signal for the measurement of the envelope power than for the measurement of the mean-power value.

20 Claims, 4 Drawing Sheets

U.S. PATENT DOCUMENTS

| | | | |
|---|---|---|---|
| 5,459,464 A | 10/1995 | Beneteau et al. | |
| 5,493,298 A * | 2/1996 | Bartz | 341/131 |
| 5,574,380 A | 11/1996 | Dubin | |
| 6,362,677 B1 * | 3/2002 | Petrofsky | 327/348 |
| 6,794,881 B1 * | 9/2004 | Reichel et al. | 324/522 |

FOREIGN PATENT DOCUMENTS

| | | |
|---|---|---|
| DE | 693 22 762 T2 | 6/1999 |
| DE | 199 55 342 A1 | 5/2001 |
| DE | 695 21 938 T2 | 4/2002 |
| DE | 693 30 597 T2 | 6/2002 |
| DE | 693 30 744 T2 | 7/2002 |
| EP | 0 181 719 A1 | 5/1986 |
| EP | 0 607 712 A1 | 7/1994 |
| GB | 2 067 373 A | 7/1981 |
| GB | 2067373 A | 7/1981 |
| GB | 2 227 381 A | 7/1990 |
| WO | WO 98/04926 A1 | 2/1998 |
| WO | 0136988 A1 | 5/2001 |
| WO | WO 01/36988 A1 | 5/2001 |
| WO | WO 03/065057 A1 | 8/2003 |

OTHER PUBLICATIONS

International Preliminary Report on Patentability, PCT/EP2007/003701, Jan. 29, 2009, pp. 1-11.

* cited by examiner

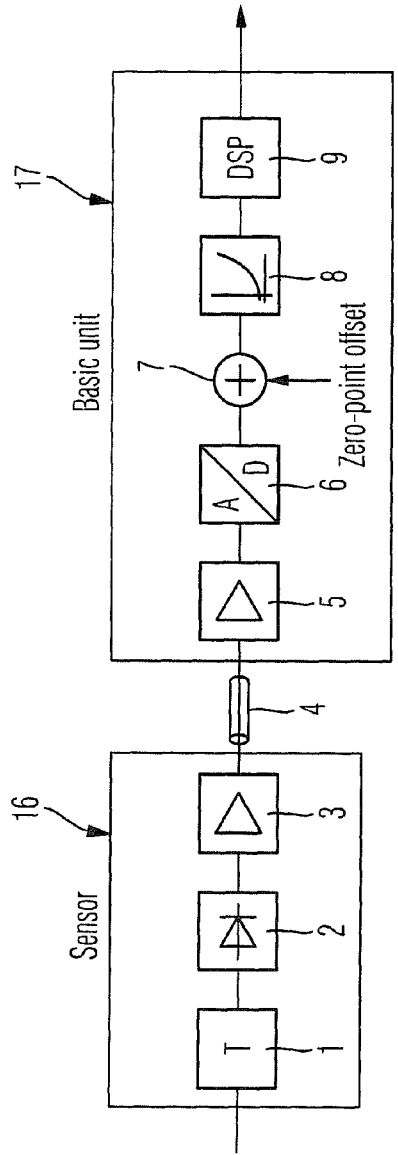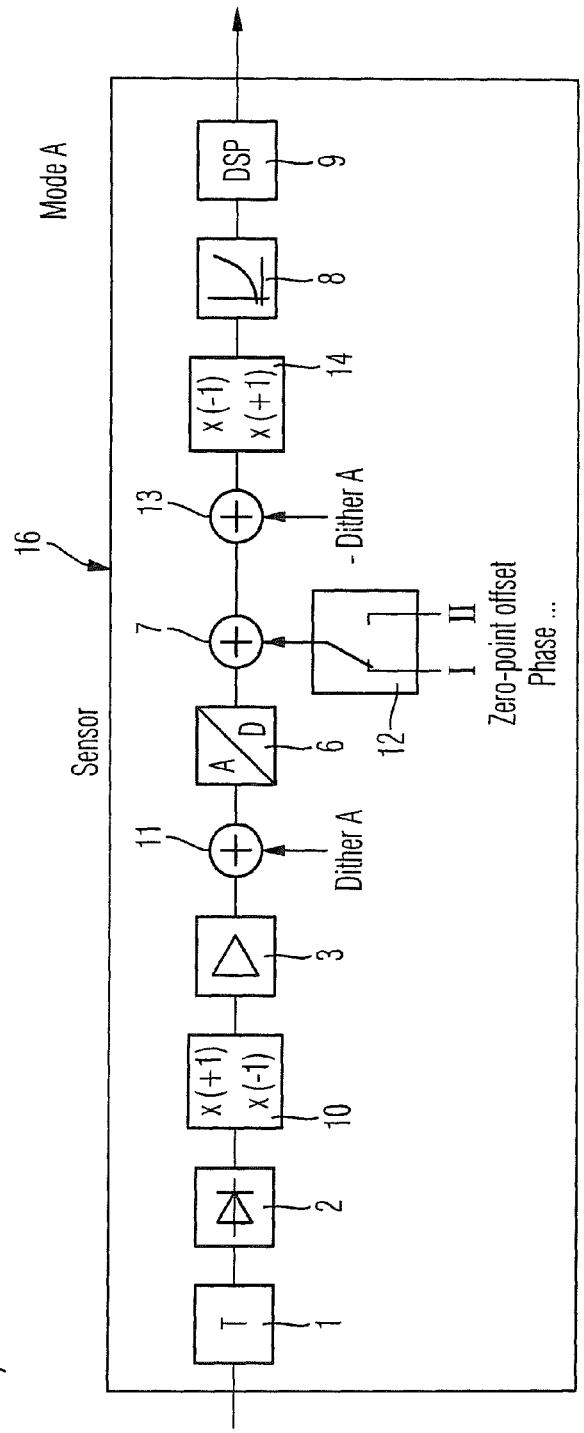
Fig. 1 (Prior art)
Fig. 2

```
0 0 0 0
0 0 0 1
0 0 1 0
0 0 1 1
0 1 0 0
0 1 0 1
0 1 1 0
0 1 1 1
1 0 0 0
↑      ↑
LSB   MSB
```
Fig. 5
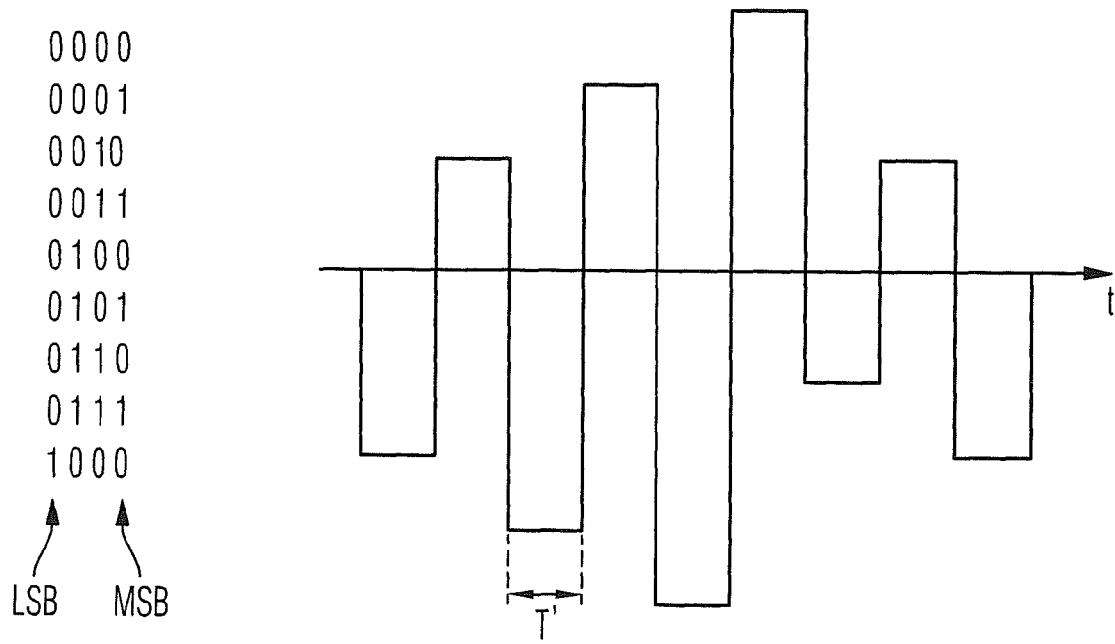
Fig. 6A
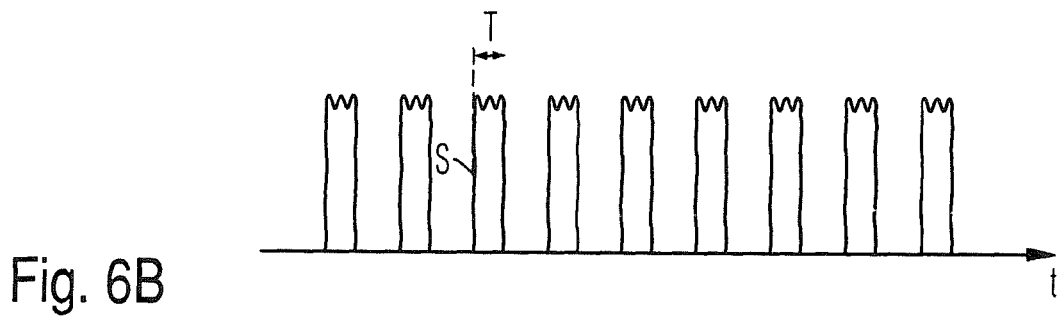
Fig. 6B
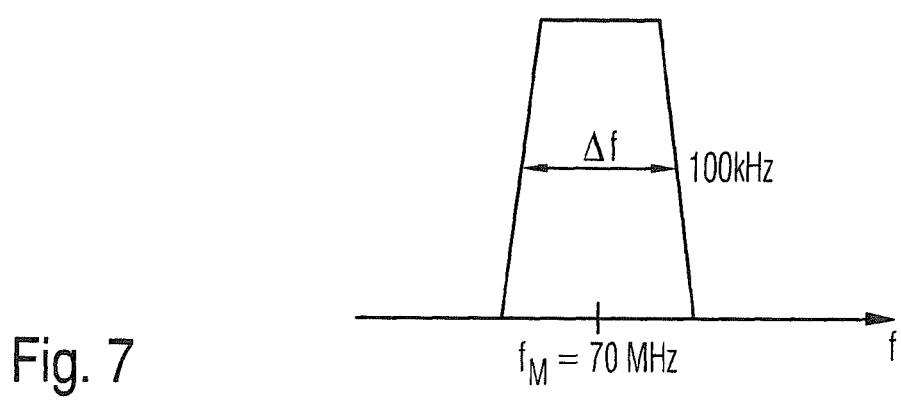
Fig. 7

MEASURING DEVICE AND MEASURING METHOD FOR MEASURING THE ENVELOPE POWER AND THE MEAN-POWER VALUE

CROSS-REFERENCE TO RELATED APPLICATION

The present application claims priority to PCT Application No. PCT/EP2007/003701, filed on Apr. 26, 2007, German Patent Application No. 10 2006 024 698.5, filed on May 26, 2006, and German Patent Application No. 10 2006 038 031.2, filed on Aug. 14, 2006, the entire contents of which are herein incorporated by reference.

BACKGROUND OF THE INVENTION

1. Field of the Invention

The invention relates to a measuring device for measuring the envelope power and the mean-power value of a high-frequency signal.

2. Discussion of the Background

A measuring device is known from DE 199 55 342 A1. With the measuring device disclosed in this specification, it is possible to measure both the envelope power and also the mean-power or RMS (root mean square) value. To cover the maximum possible dynamic range, the measurement range is divided into several subdivisions, which are allocated respectively to several measurement branches arranged parallel to one another. A chopper is disposed in each measurement branch, both of which are controlled synchronously. Furthermore, an analog/digital converter, which is supplied with a synchronous clock-pulse rate, is arranged in each measurement branch. After a weighted addition of the digitized measured signals of the individual measurement branches, a synchronous demodulation is implemented before the signal is evaluated.

The disadvantage of the measuring device known from DE 199 55 342 A1 is the use of parallel measurement branches, as a result of which the measuring device suffers from an extremely complex design. Alongside the synchronization of the choppers and the analog/digital converters, it must also be ensured that the group delay time of the measured signal is exactly equal in all measurement branches. In practice, this causes problems, especially with regard to video bandwidths to be realized within the order of magnitude of 30 MHz. With a single-path realization of the measuring device, it must be ensured that the analog/digital converter is not overdriven at the upper end of the dynamic range. This leads to a relatively poor signal level at the lower end of the dynamic range. Accordingly, special measures must be implemented to guarantee a good measurement accuracy.

SUMMARY OF THE INVENTION

The invention is based upon the object of providing a measuring device and a measuring method for measuring the envelope power and the mean-power value of a high-frequency signal, which allow/s good measurement accuracy in spite of the use of only a single measurement branch.

According to the invention, it is proposed to supply a dither signal upstream of the analog/digital conversion, wherein a different dither signal is used for the measurement of the envelope power than for the measurement of the mean-power value. This allows an optimum adaptation of the dither signal to the measurement task.

If the envelope power is being measured, the dither signal should not be changed during a recording of the measurement series. Typically, several measurement series are recorded in succession. For example, the characteristic of the envelope power during a transmission burst of a mobile-telephone signal may be of interest. In this context, a trigger is generally set, so that the measurement recording begins when the trigger value is exceeded, and the envelope power is detected during a specified time, over which the burst extends. The first dither signal used for the measurement of the envelope power should be held constant during this measurement recording. Following this, while the measuring device is waiting for the next burst, the dither signal should be varied, so that the next measurement recording of the next burst is implemented with a different dither. The dither with the dither signal added to the actual measured signal causes the discretization thresholds of the analog/digital converter to be disposed at different positions relative to the measured signal. If an averaging is implemented over several measurement recordings, the discretization errors will be averaged out.

If the mean-power value is to be measured instead, it is advantageous to use a different dither signal, namely a type of dither signal, which changes constantly from one sampled value to the next sampled value and accordingly allows an optimal suppression of the discretization error through continuous variation of the discretization thresholds of the analog/digital converter relative to the measured signal. In order to detect the mean-power value, it is not necessary for the measured signal to be changed during the measurement recording, because the variation of the individual power values caused by the dither disappears in the statistical average as a result of the averaging of individual measured power values implemented in calculating the mean power value.

The first dither signal used for the measurement of the envelope power is preferably a piecewise-constant signal, which is generated with a large amplitude variation with identical relative frequency of the individual values. For example, a counter, which generates continuously-incremented digital words, is suitable for generating a signal of this kind. In interpreting the counter result, if the value of the bits is reversed, that is to say, the least-significant bit (LSB) is exchanged with the most-significant bit (MSB) in an offset binary presentation, a digital-value sequence is obtained, which continuously changes its sign and its amplitude. Through digital/analog conversion, an analog signal can then be generated, which can be added to the measured signal before the analog/digital conversion. The elimination in the equivalent digital signal after the analog/digital conversion can then be implemented in a very simple manner by once again subtracting, or respectively by adding with an inverted sign, the digital value of the dither signal from/to the digital value.

By way of example, a phase-modulated sinusoidal signal, which can be at least partially eliminated from the digital signal by a filter operating as a band-stop filter, is suitable as the second dither signal for measuring the mean-power value. The fact that the phase-modulated signal cannot be completely eliminated is also not detrimental in view of the averaging.

To reduce the 1/f noise and to minimize the influence of thermal drift in the DC amplifier, it is advantageous to arrange a chopper in front of the DC amplifier, which periodically chops the analog detector signal with a chopper signal. The signal inversion caused by chopping can subsequently be removed from the digital signal by a synchronous demodulator.

BRIEF DESCRIPTION OF THE DRAWINGS

An exemplary embodiment of the invention is described in greater detail below with reference to the drawings. The drawings are as follows:

FIG. 1 shows a measuring device according to the prior art;

FIG. 2 shows an exemplary embodiment of the measuring device according to the invention in a first operating mode A for measuring the envelope power;

FIG. 5 shows a schematic presentation of the digital words generated by the counter in FIG. 4 and their interpretation at the input of the digital/analog converter presented in FIG. 4;

FIG. 6A shows the first dither signal Dither A at the output of the digital/analog converter in FIG. 4;

FIG. 6B shows a burst signal to be measured with reference to the first dither signal presented in FIG. 6A; and FIG. 7 shows the spectrum of the phase-modulated, second dither signal Dither B.

DETAILED DESCRIPTION OF EXEMPLARY EMBODIMENTS OF THE INVENTION

Figure 3:
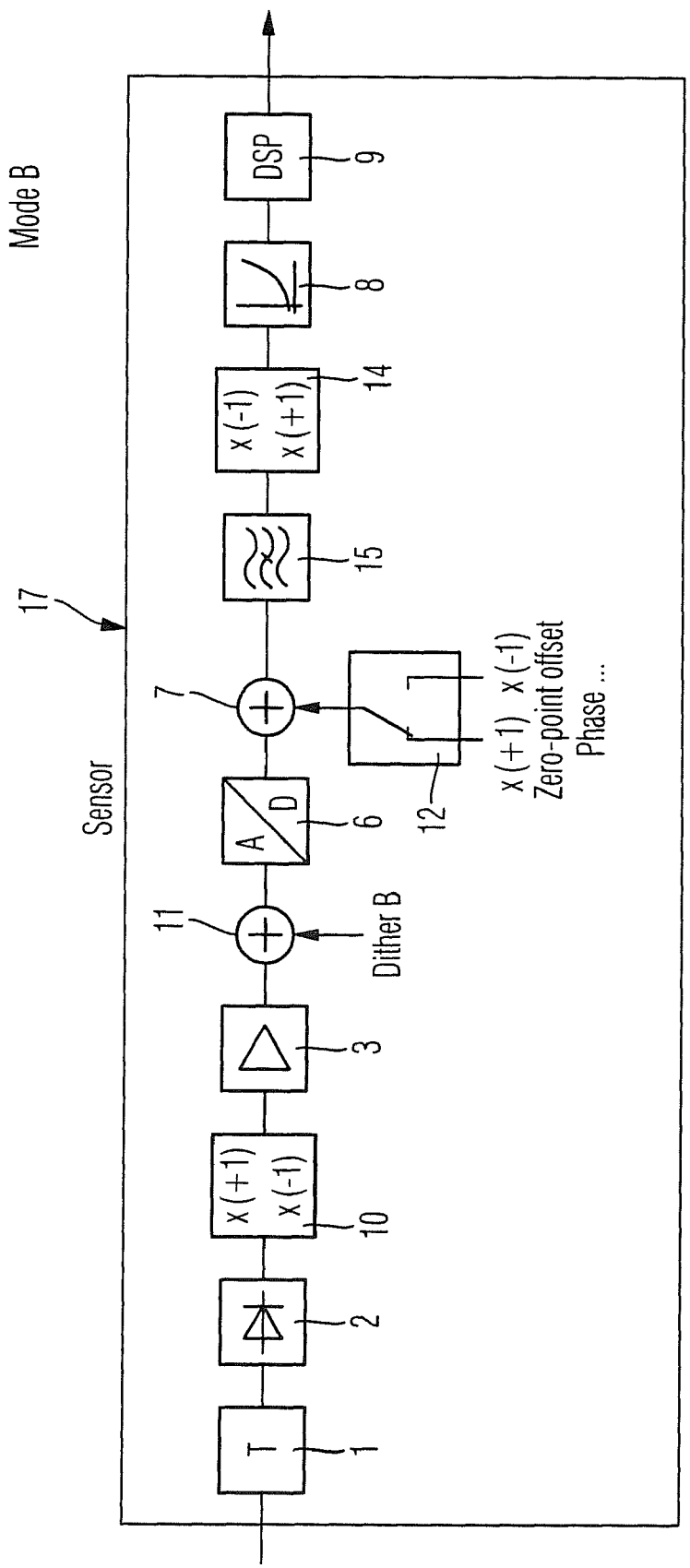
FIG. 3 shows an exemplary embodiment of the measuring device according to the invention in a second operating mode B for measuring the mean-power value.

FIG. 1 shows a hitherto usual configuration of a measuring device for measuring the envelope-power and the average-power value. An attenuation element 1, an envelope detector 2, which can be designed as a diode detector, and a pre-amplifier or respectively line driver 3 are arranged in a sensor 16. The sensor 16 is connected via a connecting cable 4 to the basic unit 17. The main amplifier 5, an analog/digital converter 6, a summation stage 7 for subtraction of the zero-point offset, a device 8 for curve correction and a digital signal processor with further evaluation functions, for example, for displaying the envelope curves, for calculation of the average-power value and so on, are disposed in the basic unit 17. The device for curve correction 8 and the digital signal processor 9 together form an evaluation device 8, 9.

FIG. 2 shows an exemplary embodiment of the measuring device according to the invention in a first operating mode A, which is used for measuring the envelope power. One difference from the configuration shown in FIG. 1 is that all of the components of the measuring device according to the invention are preferably disposed in the sensor 16. A special basic unit exclusively for the power measurement may then not be required under some circumstances. The sensor 16 can be connected directly to a PC, for example, via a USB bus.

However, the essential difference is that a supply device 11 for the supply of a dither signal is disposed between the detector 2 and the analog/digital converter 6, preferably after the amplifier 3. In this context, the supply device 11 supplies a first dither signal Dither A for the measurement of the envelope power and a different, second dither signal Dither B illustrated in FIG. 3 for the measurement of the mean-power value.

The value of the first dither signal Dither A is preferably not changed during the recording of a measured-value series consisting of several measured values of the envelope power, but is varied only between the individual measured-value recordings. This will be illustrated below. The first dither signal Dither A can be eliminated from the measured signal, which has been digitized through the analog/digital converter 6, in a dither elimination device 13. In the exemplary embodiment presented in FIG. 2, the dither elimination device 14 for the first dither signal Dither A consists of an adder, to which the digital equivalent of the first dither signal with an inverted sign (-Dither) is supplied, so that the digital equivalent of the first dither signal is subtracted from the digitized measured signal.

Moreover, a chopper 10 is disposed between the detector 2 and the DC amplifier 3. The chopper 10 chops the measured signal, by inverting the sign of the analog signal in a cyclical manner. Chopping provides the advantage that the influence of the thermal drift of the DC amplifier 3 is considerably reduced. The influence of the 1/f noise is also reduced. A synchronous demodulator 14, which multiplies the digitized measured signal by -1 or respectively +1 synchronously with the chopper 10 and accordingly eliminates the influence of the chopper, is disposed after the analog/digital converter 6. This alternation of sign can be implemented numerically in a very simple manner without real multiplication.

A further peculiarity of the exemplary embodiment illustrated in FIG. 2 is that, in order to correct the zero-point offset, the device 7, 12 provides a switching device 12, which allows a different zero-point correction for the two chopper phases +1 and -1 of the chopper 10. The zero-point offsets can be stored independently of one another for the two chop phases in a memory device, which is not illustrated. The switching device 12 is operated synchronously with the chopper 10.

FIG. 3 shows the exemplary embodiment of the sensor 16 according to the invention already described with reference to FIG. 2 in a second operating mode B, which is used to register the mean-power value of the high-frequency signal to be measured. According to the invention, a second dither signal Dither B, which is fundamentally-different from the first dither signal Dither A, is used for the measurement of the mean-power value. By preference, a phase-modulated sinusoidal signal is used as the second dither signal Dither B. However, a number of other possibilities are conceivable, for example, a frequency-modulated sinusoidal signal or, if required, also an amplitude-modulated signal.

In operating mode B, the second dither signal Dither B is also supplied via a supply device 11 upstream of the analog/digital converter 6. The phase-modulated sinusoidal signal preferably provides a frequency between the maximum frequency of the measured signal and the sampling frequency of the analog/digital converter 6. This dither signal causes every sampled value to be changed somewhat differently. As a result, an effective dither is very rapidly achieved. However, in this context, the envelope curve of the signal is also changed, for which reason, the second dither signal Dither B is not suitable for the measurement of the envelope power.

In order to eliminate at least a large proportion of the second dither signal Dither B, a band-stop filter 15, which is implemented as a digital filter, is preferably provided in the digital signal path. However, the second dither signal Dither B cannot be completely eliminated by this band-stop filter 15. In fact, this is not detrimental for the determination of the mean-power value, because the mean value of the individual measured power levels is calculated in the digital signal processor 9 of the evaluation device 8, 9, and, with a symmetrical distribution of the relative frequency of the individual amplitude values of the dither signal Dither B, this dither signal no longer has any influence on the calculated mean value in the case of an averaging over a sufficiently large number of individual values.

Figure 4:
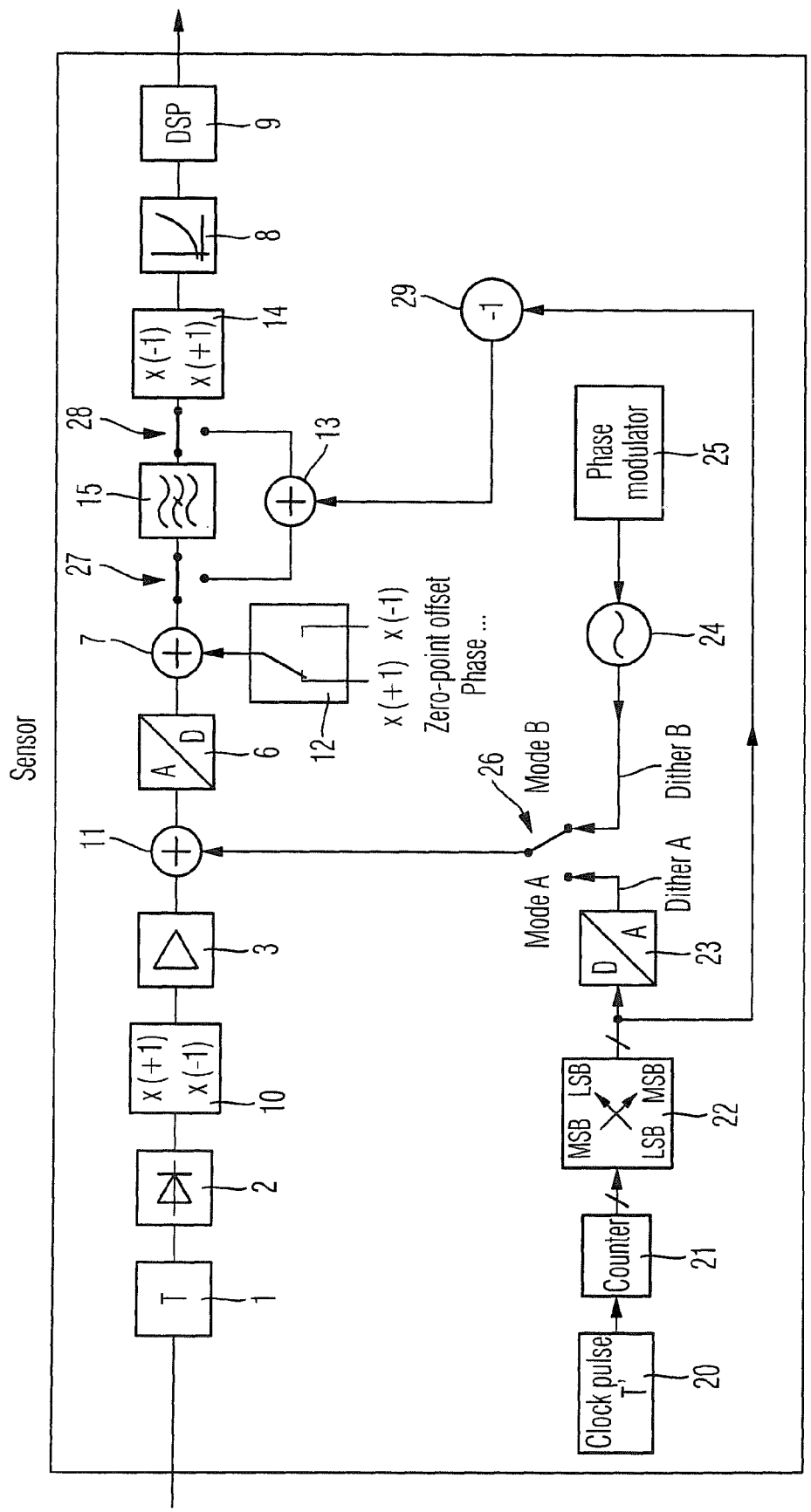
FIG. 4 shows a more detailed block-circuit diagram of the exemplary embodiment of the measuring device according to the invention.

FIG. 4 shows a more detailed block-circuit diagram, in which the two operating modes A and B illustrated in FIGS. 2 and 3, are combined. It is possible to switch between mode A and mode B using the switching elements 26, 27 and 28. In mode A, the switching element 26 supplies the dither signal Dither A to the supply device 11; and in mode B, the switching element 26 supplies the dither signal Dither B to the supply device 11.

FIG. 4 shows an exemplary embodiment of the generation of the dither signal Dither A. With this exemplary embodiment, a counter 21 counts continuously upwards at the clock pulse of the clock-pulse rate specified by the clock-pulse generator 20. In the case of a simplified example of a 4-digit counter, the data word at the output of the counter 21 is shown in FIG. 5. The values of the individual bits of the digital word generated by the counter 21 are reversed in the unit 22, that is to say, the least-significant bit LSB becomes the most-significant bit MSB; the most-significant bit MSB becomes the least-significant bit LSB; the second least-significant bit becomes the second most-significant bit; the second most-significant bit becomes the second least-significant bit and so on. This reversed interpretation of the bit values of the data word generated by the counter 21 is characterized in FIG. 5 with reference to LSB and MSB.

If the data word with its reversed bit value is now interpreted in a two's complementary presentation, in which the most-significant bit MSB characterizes the sign of the data word, or in an offset-binary presentation, and if this data sequence is supplied to a digital/analog converter 23, an analog signal is obtained as illustrated in FIG. 6A. This is a rectangular signal, of which the sign changes corresponding with the clock-pulse rate specified by the clock-pulse generator 20, wherein the amplitudes from impulse to impulse rise and fall in a step like manner.

If the switching element 26 is switched into the position marked Mode A, the dither signal Dither A generated by the digital/analog converter 23 is supplied to the dither supply device 11, in which it is superimposed on the measured signal. FIG. 6B illustrates schematically the recording time T, during which the envelope power is registered by the measuring device according to the invention, with reference to the duration T' of a half wave of the first dither signal Dither A. The measurement example presented in a very schematic manner in FIG. 6B assumes that the high-frequency signal to be measured consists of several bursts, as is conventional in the case of mobile-telephone signals, especially according to the GSM standard. After the power level has risen above the threshold value S, the time characteristic of the envelope power, which depends inter alia upon the modulation, must be recorded.

During the recording period T, the dither signal Dither A preferably remains constant, so that the envelope of the measured signal is not changed by the dither signal Dither A used in the measurement of the envelope power. The dither signal Dither A is varied only between the individual recordings, in the measurement example illustrated in FIG. 6B, that is to say, between the bursts, so that it is provided with a different sign and a different amplitude for the next measurement recording. For every recording, the dither value is therefore changed somewhat, so that the discretization thresholds of the analog/digital converter relative to the measured signal are varied somewhat for every recording. If an averaging of all of the recordings is implemented in the context of a so-called "averaging" mode, not only is the signal/noise ratio improved as a result; the discretization error of the analog/digital converter is also reduced. However, it is important that the dither signal Dither A is not changed during the measurement recording.

The digital value corresponding to the dither signal Dither A is inverted via an inverter 27, which inverts the sign of the digital value; it is then supplied to the adding unit 13, where it is deducted from the digitized measured signal. Of course, a subtraction unit can also be used instead of an adding unit 13, and the inverter 29 can be omitted. In this context, the switching elements 27 and 28 are not disposed in the switching position illustrated in FIG. 4, but in the other switching position.

As already explained, a different dither signal Dither B, which is not held constant throughout the measurement recording, but which is varied from sampled value to sampled value of the digital/analog converter 6, is used for the measurement of the mean-power value. This can be achieved, for example, by phase-modulating a sine-wave generator 24 by means of a phase modulator 25. FIG. 7 illustrates schematically the spectrum of this phase-modulated sinusoidal signal, which is used as the second dither signal Dither B. Within a bandwidth $\Delta f$, the frequency varies, for example, by 100 kHz, around a mid-frequency $f_M$ of, for example, 70 MHz. The mid-frequency $f_M$ should be disposed between the maximum signal frequency of the measured signal and the sampling frequency of the analog/digital converter 6. This constantly-changing second dither signal Dither B causes every sampled value to be changed somewhat. As a result, an effective dither is achieved very rapidly. However, this also changes the envelope curve of the signal, so that the dither signal Dither B is not suitable for the measurement of the envelope power. Accordingly, the per se more-effective dither signal Dither B is used exclusively for the measurement of the mean-power values.

The invention is not restricted to the exemplary embodiment illustrated. With regard to the dither signal Dither A, it is in fact advantageous, but not absolutely necessary, for the sign of the dither signal to change from clock pulse to clock pulse. The second dither signal Dither B can also be generated in different ways, for example, by supplying a pseudo-random binary sequence to a digital/analog converter. All of the features described above or illustrated in the drawings can be combined with one another as required within the framework of the invention.

The invention claimed is:

1. A measuring device for measuring the envelope power and the mean-power value of a high-frequency signal comprising:
   a detector for detecting the high-frequency signal and for generating an analog detector signal, with an analog/digital converter for generating a digital signal, with an evaluation device for evaluating the digital signal,
   wherein a dither supply device for the supply of a dither signal is disposed between the detector and the analog/digital converter,
   wherein the dither supply device supplies a different dither signal for the measurement of the envelope power than for the measurement of the mean-power value, and
   wherein, for the measurement of the envelope power, a first dither signal is supplied, which is not changed during the recording of measured-value series consisting of several measured values of the envelope power, but is varied between the recordings of the measurement series, and
   wherein a second dither signal, which is varied continuously, is supplied for the measurement of the mean-power value.

2. The measuring device according to claim 1, wherein the first dither signal is generated via a digital/analog converter from a cyclical digital-value sequence, wherein adjacent digital values of the digital-value sequence provide a relatively-large value difference in the statistical average.

3. The measuring device according to claim 2, wherein the cyclical digital-value sequence is generated by a counter, wherein the most-significant bit of each digital value generated by the counter is used as the least-significant bit of the digital/analog converter; and the least-significant bit of each digital value generated by the counter is used as the most-significant bit of the digital/analog converter.

4. The measuring device according to claim 2, wherein a dither elimination device for the elimination of the first dither signal is disposed between the analog/digital converter and the evaluation device.

5. The measuring device according to claim 1, wherein the second dither signal is generated by an oscillator, which is phase-modulated by a phase modulator within a specified bandwidth around a specified mid-frequency.

6. The measuring device according to claim 5, wherein the oscillator generates a phase-modulated sinusoidal signal.

7. The measuring device according to claim 5, wherein a band-stop filter for at least partial filtering out of the second dither signal is disposed between the analog/digital converter and the evaluation device.

8. The measuring device according to claim 1, wherein a chopper is disposed between the detector and the analog/digital converter, and a synchronous demodulator is disposed between the analog/digital converter and the evaluation device.

9. The measuring device according claim 1, wherein a device for the correction of a zero-point offset is disposed between the analog/digital converter and the evaluation device.

10. A measuring method for measuring the envelope power and the mean-power value of a high-frequency signal comprising the following procedural stages:
   generating an analog detector signal by detecting the high-frequency signal,
   analog-digital converting and generating a digital signal indirectly or directly from the detector signal and
   evaluating the digital signal,
   wherein a dither signal is supplied before the analog/digital conversion, wherein a different dither signal is supplied for the measurement of the envelope power than for the measurement of the mean-power value and
   wherein, for the measurement of the envelope power, a first dither signal is supplied, which is not changed during the recording of measured-value series consisting of several measured values of the envelope power, but is varied between the recordings of the measurement series, and
   wherein a second dither signal, which is varied continuously, is supplied for the measurement of the mean-power value.

11. The measuring method according to claim 10, wherein the first dither signal is generated via a digital/analog converter from a cyclical digital-value sequence, wherein adjacent digital values of the digital-value sequence provide a relatively-large value difference in the statistical average.

12. The measuring method according to claim 11, wherein the cyclical digital-value sequence is generated by a counter, wherein the most-significant bit of each digital value generated by the counter is used as the least-significant bit of the digital/analog converter; and the least-significant bit of each digital value generated by the counter is used as the most-significant bit of the digital/analog converter.

13. The measuring method according to claim 10, wherein the first dither signal is eliminated again after the analog/digital conversion.

14. The measuring method according to claim 13, wherein the second dither signal is varied within a specified bandwidth around a specified mid-frequency by a phase modulation.

15. The measuring method according to claim 14, characterised in that the second dither signal is a phase-modulated sinusoidal signal.

16. The measuring method according to claim 14, wherein the second dither signal is removed by a band-stop filter.

17. The measuring method according to claim 10, wherein the detector signal is chopped before the analog/digital conversion and synchronously demodulated after the analog/digital conversion.

18. The measuring method according to claim 10, wherein a correction of a zero-point offset is implemented after the analog/digital conversion.

19. The measuring device according to claim 10, wherein a dither elimination device for the elimination of the first dither signal is disposed between the analog/digital converter and the evaluation device.

20. The measuring device according to claim 1, wherein a band-stop filter for at least partial filtering out of the second dither signal is disposed between the analog/digital converter and the evaluation device.

* * * * *